(12) United States Patent
Zhou et al.

(10) Patent No.: US 7,173,340 B2
(45) Date of Patent: Feb. 6, 2007

(54) DAISY CHAINING OF SERIAL I/O INTERFACE ON STACKING DEVICES

(75) Inventors: Binling Zhou, Tucson, AZ (US); James L. Todsen, Tucson, AZ (US); Brian D. Johnson, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 345 days.

(21) Appl. No.: 10/919,768

(22) Filed: Aug. 16, 2004

(65) Prior Publication Data

US 2005/0184398 A1 Aug. 25, 2005

Related U.S. Application Data

(60) Provisional application No. 60/548,238, filed on Feb. 25, 2004.

(51) Int. Cl.
  *H01L 23/48* (2006.01)
  *H01L 23/52* (2006.01)
  *H01L 23/34* (2006.01)
  *H01L 21/00* (2006.01)
  *H05K 7/00* (2006.01)

(52) U.S. Cl. ............ 257/777; 257/686; 257/724; 257/725; 257/726; 257/727; 257/728; 361/735; 361/783; 438/109; 438/455; 326/104

(58) Field of Classification Search ............ 257/686, 257/777, 724–728; 361/735, 783
See application file for complete search history.

(56) References Cited

U.S. PATENT DOCUMENTS 5,905,639 A * 5/1999 Warren .............. 361/776
6,759,307 B1 * 7/2004 Yang ............ 438/455
6,777,797 B2 * 8/2004 Egawa ............ 257/686
6,777,799 B2 * 8/2004 Kikuma et al. ............ 257/686
6,803,254 B2 * 10/2004 Park et al. ............ 438/109
7,023,079 B2 * 4/2006 Wang et al. ............ 257/686
7,067,927 B1 * 6/2006 Mostafazadeh ............ 257/777
2003/0178715 A1 * 9/2003 Sturcken et al. ............ 257/686
2005/0006785 A1 * 1/2005 Liu et al. ............ 257/777
2005/0110126 A1 * 5/2005 Wu ............ 257/686
2006/0076690 A1 * 4/2006 Khandros et al. ............ 257/777

* cited by examiner

*Primary Examiner*—Rexford Barnie
*Assistant Examiner*—Dylan White
(74) *Attorney, Agent, or Firm*—W. James Brady, III; Frederick J. Telecky, Jr.

(57) ABSTRACT

A bottom die and a top die stacked on the bottom die are configured to provide a daisy chain function. Both die include an input/output function control bonding pad (20G), a first bonding pad (20C) controllable to function as either an input or an output, and a second bonding pad (20E) controllable to function as either an output or an electrically floating pad in response to a corresponding input/output function control signal. The top die (30) is stacked on the bottom die (20) and the first bonding pad (20C) of the bottom die (20) is wire bonded to the first bonding pad (30C) of the top die (30). A first reference voltage (VDD) on the function control bonding pad of the bottom die configures its first bonding pad as an output and its second bonding pad as electrically floating, and a second reference voltage (VSS) on the function control bonding pad of the top die configures its first bonding pad as an input and its second bonding pad as an output, to thereby provide the daisy chain function.

21 Claims, 6 Drawing Sheets

DAISY CHAINING OF SERIAL I/O INTERFACE ON STACKING DEVICES

This application claims the benefit of prior filed co-pending U.S. provisional application Ser. No. 60/548,238 filed Feb. 25, 2004 entitled "DAISY CHAINING SERIAL I/O INTERFACE ON STACKING DEVICES" by Binling Zhou, James L. Todsen and Brian Johnson.

BACKGROUND OF THE INVENTION

The present invention relates generally to circuitry and methods for stacking integrated circuit die, and more particularly to a circuit configuration and method which allow controlling input/output functions of stacked integrated circuit die by means of simple bonding connections in the stacked die arrangement.

In some applications, it is conventional to "stack" integrated circuit die (i.e., integrated circuit die), one on top of the other, in order to conserve area on a printed circuit board and/or to improve circuit performance. Also, in some applications it is conventional to provide a "daisy chained" connection of outputs of various digital circuits wherein the output signal of a first digital circuit appears on a daisy chained output during a first time frame and the digital output signal of a second digital circuit appears on the daisy chained output terminal of the first digital circuit during the next time frame, in order to reduce the number of output terminals and complexity of associated circuitry that would be required for reading the data on numerous output terminals.

FIG. 1A illustrates a partial section view of an assembly 1 including an exposed thermal pad 2, a bottom die 4 attached to the upper surface of the thermal pad 2, one or more bonding wires 7 connected between one or more bonding pads (not shown) on the upper peripheral surface of bottom die 4 and pads or package leads of an ordinary package lead frame 3 In some cases, one or more dimensions of the top die 6 are smaller than those of bottom die 4, as shown. An insulating spacer, typically composed of silicon roughly 10 mills thick, attaches a top die 6 to the upper surface of bottom die 4 in such manner as to expose the peripheral bonding pads (not shown) on the upper peripheral surface of bottom die 4 and allow the bonding wires 7 to extend from various peripheral exposed bonding pads of bottom die 4 to the various package leads 3. Preferably, various bonding pads on the upper peripheral surface of top die 6 are connected by bonding wires 8 to various pads or package pins of package lead frame 3. Molding or encapsulating compound 45 encapsulates the structure as shown.

FIG. 1B shows a prior art arrangement of three integrated circuit chips 101,102, and 103 each directly attached to the surface of a printed circuit board 100, wherein each of the three chips includes an ADC (analog-to-digital converter) 105A, 105B, and 105C, respectively. Analog input signals ANALOGIN1, ANALOGIN2 and ANALOGIN3 on conductors 107, 108, and 109, respectively, are provided as inputs to the three ADCs, respectively.

Each of the three chips 101, 102, and 103 also includes conventional daisy chain circuitry including serial data shift registers 106A, 106B and 106C for receiving the digital outputs DOUT of ADCs 105A, 105B and 105C, respectively. The digital outputs of the three ADCs 105 are coupled to parallel digital inputs of the serial data shift registers 106A, 106B and 106C, respectively. Each of the three data registers is clocked by a data clock signal DCLK. The digital serial input DIN of data register 106A of the first chip 101 is connected to ground so that only "0"s can be serially shifted into it from left to right. The serial digital output DOUT of data register 106A is connected to the serial digital input DIN of data register 106B, the serial digital output DOUT of which is connected to DIN of data register 106C. DOUT of data register 106C is connected to a serial data output conductor 112.

After the three analog input signals on conductors 107, 108, and 109 have been converted to digital values which have been loaded via three digital buses or channels into the three data registers 106A, 106B, and 106C respectively, the three digital conversion result output words can be serially shifted out of data output conductor 112 in response to the DCLK clock signal. As the three output words are shifted from left to right in FIG. 1B, they are replaced by "0"s.

The prior art shown in FIG. 1B requires much more printed circuit board area than is desirable.

It would be very desirable to have a more efficient technique and structure for daisy chaining a number of digital data channels using stacking die technology.

Thus, there is an unmet need for an integrated circuit die-stacking configuration that minimizes the number of bonding pads required on each integrated circuit die.

There is another unmet need for an integrated circuit die-stacking configuration that reduces or minimizes circuit and system delay due to capacitive loading effects of unused output pads.

There is another unmet need for an integrated circuit die-stacking configuration and associated circuitry in the die that disables the driving of unused bonding pads that could cause noise coupling to nearby analog circuits.

SUMMARY OF THE INVENTION

It is an object of the invention to provide an integrated circuit die-stacking configuration and input/output control circuit that minimizes the number of bonding patents required on each integrated circuit die.

It is another object of the invention to provide a more efficient technique and structure for daisy chaining a number of digital data channels using stacking die technology.

It is another object of the invention to provide an integrated circuit die-stacking configuration and input/output control circuit that reduces or minimizes circuit and system delay due to capacitive loading effects of unused output pads.

It is another object of the invention to provide an integrated circuit die-stacking configuration and associated circuitry in the die that disables the functionality of unused bonding pads that could cause noise coupling to nearby analog circuits.

Briefly described, and in accordance with one embodiment, the present invention provide a first integrated circuit die (20) adapted for die stacking, including an input/output function control bonding pad (20G), a first bonding pad (20C) controllable to function as either an input or an output in response to an input/output function control signal applied to the input/output function control bonding pad (20G), a second bonding pad (20E) controllable to function in a first mode or in a second mode in response to the input/output function control signal, and input/output control circuitry (200) coupled to the first bonding pad (20C) and also coupled to the input/output control bonding pad (20G). The input/output control circuitry (200) causes the first bonding pad (20C) to function as an output of the first integrated circuit die (20) when the input/output function control signal is equal to a first reference voltage (VDD) and for causing the second bonding pad (20E) to function in the first mode when the input/output function control signal is equal to the first reference voltage (VDD), and also causes the first bonding pad (20C) to function as an input of the first integrated circuit die (20) when the input/output function control signal is equal to a second reference voltage (VSS) and for causing the second bonding pad (20E) to function in the second mode when the input/output function control signal is equal to the second reference voltage (VSS). The input/output function control circuitry (200) of the first integrated circuit die (20) function in cooperation with corresponding input/output function control circuitry (300) in a second integrated circuit die (30) similar to the first integrated circuit die (20) and stacked on the first integrated circuit die (20) to form a selected path for communication of information between the first and second integrated circuit die when the first bonding pad (20C) of the first integrated circuit die (20) is connected by a wire bond to a corresponding first bonding pad (30C) of the second integrated circuit die (30).

In a described embodiment, the invention provides a first integrated circuit die (20) adapted for die stacking including an input/output function control bonding pad (20G), a first bonding pad (20C) controllable to function as either an input or an output in response to an input/output function control signal applied to the input/output function control bonding pad (20G), a second bonding pad (20E) controllable to function as either an output of the first integrated circuit die (20) or as an electrically floating bonding pad in response to the input/output function control signal, and input/output control circuitry (200) coupled to the first bonding pad (20C) and also coupled to the input/output control bonding pad (20G) for (1) causing the first bonding pad (20C) to function as an output of the first integrated circuit die (20) when the input/output function control signal is equal to a first reference voltage (VDD) and for causing the second bonding pad (20E) to function as an electrically floating bonding pad when the input/output function control signal is equal to the first reference voltage (VDD), and (2) for causing the first bonding pad (20C) to function as an input of the first integrated circuit die (20) when the input/output function control signal is equal to a second reference voltage (VSS) and for causing the second bonding pad (20E) to function as an output of the first integrated circuit die (20) when the input/output function control signal is equal to the second reference voltage (VSS).

The input/output function control circuitry (200) of the first integrated circuit die (20) functions in cooperation with corresponding input/output function control circuitry (300) in a second integrated circuit die (30) similar to the first integrated circuit die (20) and stacked on the first integrated circuit die (20) to form a daisy chain when the first bonding pad (20C) of the first integrated circuit die (20) is connected by a wire bond to a corresponding first bonding pad (30C) of the second integrated circuit die (30).

In a described embodiment, the input/output control circuitry (200) includes an input switch circuit (200C) including a pad terminal (PAD) connected to the first bonding pad (20C), a control terminal (CONTROL) coupled by a first conductor (56) to the input/output function control bonding pad (20G), an input terminal (IN) coupled to a second conductor (54B), and an output terminal (OUT) coupled to a third conductor (11B). In the described embodiments, the output switch circuit (61) includes a pad terminal (PAD) connected to the second bonding pad (20E), an enable input (EN) coupled to the input/output function control bonding pad (20G), and a data input (Y) coupled to the second conductor (54B).

In the described embodiments, the input switch circuit (200C) includes an ANDing circuit (92), an ORing circuit (91), a pull-up transistor (94), a pull-down transistor (93), a transmission gate circuit (95,96), and an inverter (90), a first input of the ANDing circuit (92) and a first input of the ORing circuit (91) being coupled to the second conductor (54B), an output of the ANDing circuit (92) being coupled to a gate of the pull-up transistor (94), an output of the ORing circuit (91) being coupled to a gate of the pull-down transistor (93), the first conductor (56) being coupled to a second input of the ANDing circuit (92) and an input of an inverter (90), an output of the inverter (90) being coupled to a second input of the ORing circuit (91). Drains of the pull-up transistor (94) and the pull-down transistor (93) are coupled to the first bonding pad (20C) and a first terminal of the transmission gate circuit (95,96), a second terminal of the transmission gate circuit (95,96) being coupled to the third conductor (11B). A control terminal of the transmission gate circuit (95,96) is coupled to the first conductor (56).

In the described embodiments, the output switch circuit (61) includes an ANDing circuit (74), an ORing circuit (75), a pull-up transistor (76), a pull-down transistor (77), and an inverter (73), a first input of the ANDing circuit (74) and a first input of the ORing circuit (75) being coupled to the second conductor (54B). And output of the ANDing circuit (74) is coupled to a gate of the pull-up transistor (76), an output of the ORing circuit (75) is coupled to a gate of the pull-down transistor (77), the first conductor (56) is coupled to a second input of the ANDing circuit (74) and an input of the inverter (73), and an output of the inverter (73) is coupled to a second input of the ORing circuit (75). Drains of the pull-up transistor (76) and first pull-down transistor (77) are coupled to the second bonding pad (20E).

In one embodiment, the first integrated circuit die includes a serial-output analog-to-digital converter (27) coupled to the second conductor (54B) to provide a stream of serial data bits to be daisy chained to an output pad (30E) of the second integrated circuit die (30).

In one embodiment, a plurality of integrated circuit die are stacked so as to provide a daisy chain function by providing a bottom integrated circuit die (20) including an input/output function control bonding pad (20G), a first bonding pad (20C) controllable to function as either an input bonding pad or an output bonding pad of the bottom integrated circuit die (20) in response to a first input/output function control signal applied to the input/output function control bonding pad (20G), and a second bonding pad (20E) controllable to function as either an output bonding pad of the bottom integrated circuit die (20) or as an electrically floating bonding pad in response to the first input/output function control signal, and providing a top integrated circuit die (30) including an input/output function control bonding pad (30G). The first bonding pad (30C) is controllable to function as either an input or an output bonding pad of the top integrated circuit die (30) in response to a second input/output function control signal applied to the input/output function control bonding pad (30G) of the top integrated circuit die (30), and a second bonding pad (30E) is controllable to function as either an input bonding pad of the top integrated circuit die (30) or as an electrically floating bonding pad in response to the second input/output function control signal. The top integrated circuit die (30) is stacked above the bottom integrated circuit die (20) and the first bonding pad (20C) of the bottom integrated circuit die (20) is wire bonded to the first bonding pad (30C) of the top integrated circuit die (30).

Input/output control circuitry (200) of the bottom integrated circuit die (20) coupled to the first bonding pad (20C) and the input/output control bonding pad (20G) of the bottom integrated circuit die (20) is operated to cause the first bonding pad (20C) of the bottom integrated circuit die (20) to function as an output bonding pad of the bottom integrated circuit die (20) when the first input/output function control signal is equal to a first reference voltage (VDD) and to cause the second bonding pad (20E) of the bottom integrated circuit die (20) to function as an electrically floating bonding pad when the first input/output function control signal is equal to the first reference voltage (VDD). Input/output control circuitry (300) of the top integrated circuit die (30) coupled to the first bonding pad (30C) and the input/output control bonding pad (30G) of the top integrated circuit die (30) is operated to cause the first bonding pad (30C) of the top integrated circuit die (30) to function as an input of the top integrated circuit die (30) when the second input/output function control signal is equal to a second reference voltage (VSS) and to cause the second bonding pad (30E) of the top integrated circuit die (30) to function as an output pad when the second input/output function control signal is equal to the second reference voltage (VSS). The input/output function control circuitry (200) of the bottom integrated circuit die (20) functions in cooperation with the input/output function control circuitry (300) in the top integrated circuit die (30) to provide a daisy chain function.

DETAILED DESCRIPTION OF THE PREFERRED EMBODIMENTS

Figure 1A:
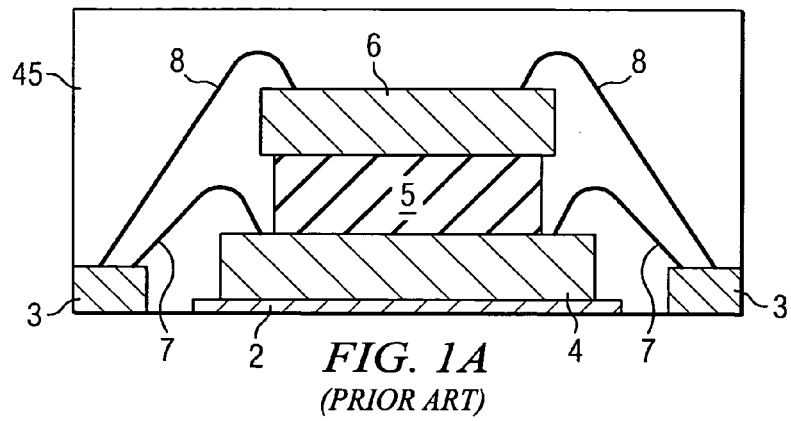
FIG. 1A is a partial edge view diagram showing a prior art arrangement in which two integrated circuit die are stacked and appropriately wire bonded on a substrate.
Figure 1B:
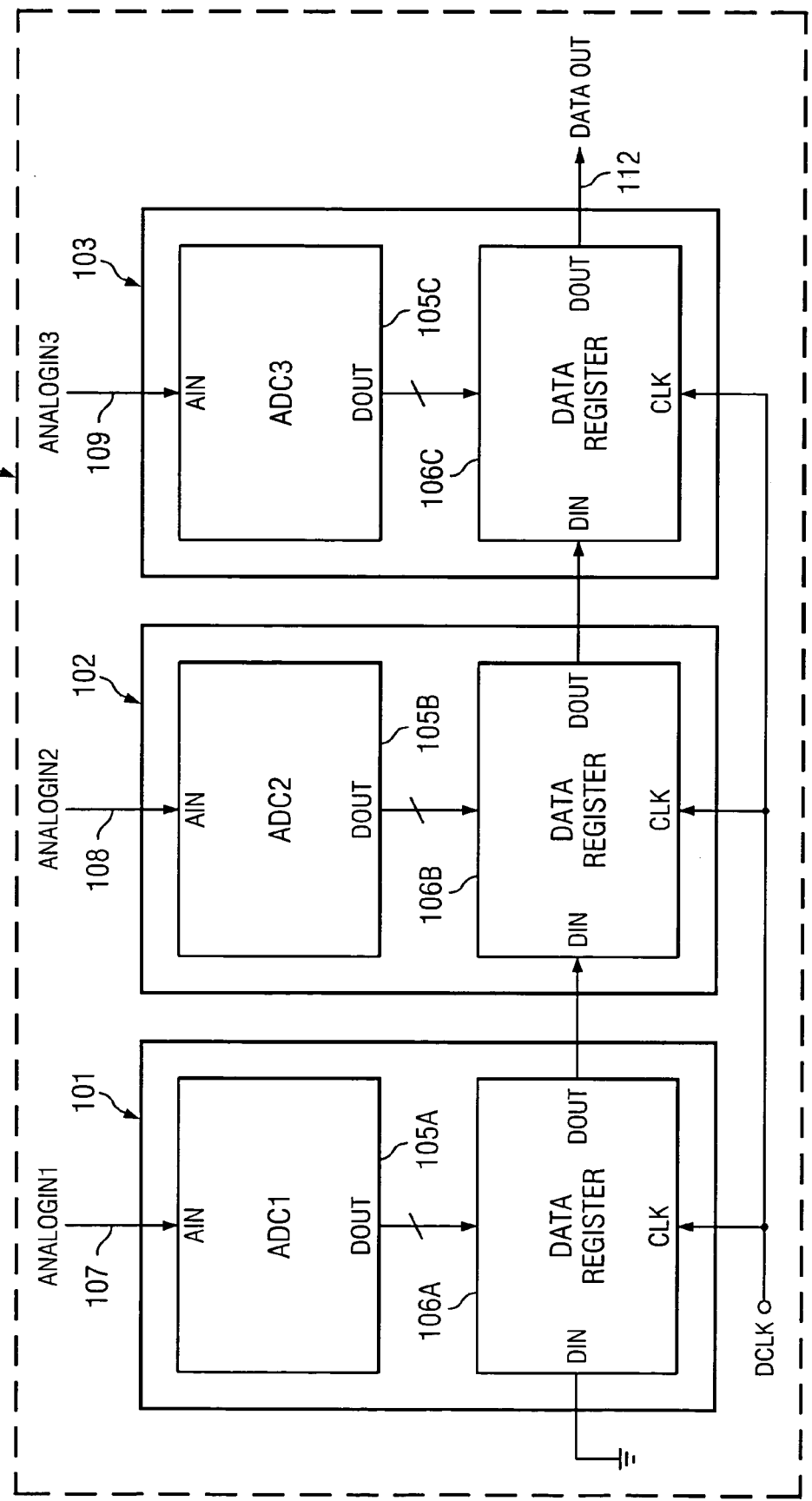
FIG. 1B is a diagram of a prior art daisy chain arrangement of integrated circuit chips each mounted directly to the credit circuit board.
Figure 2:
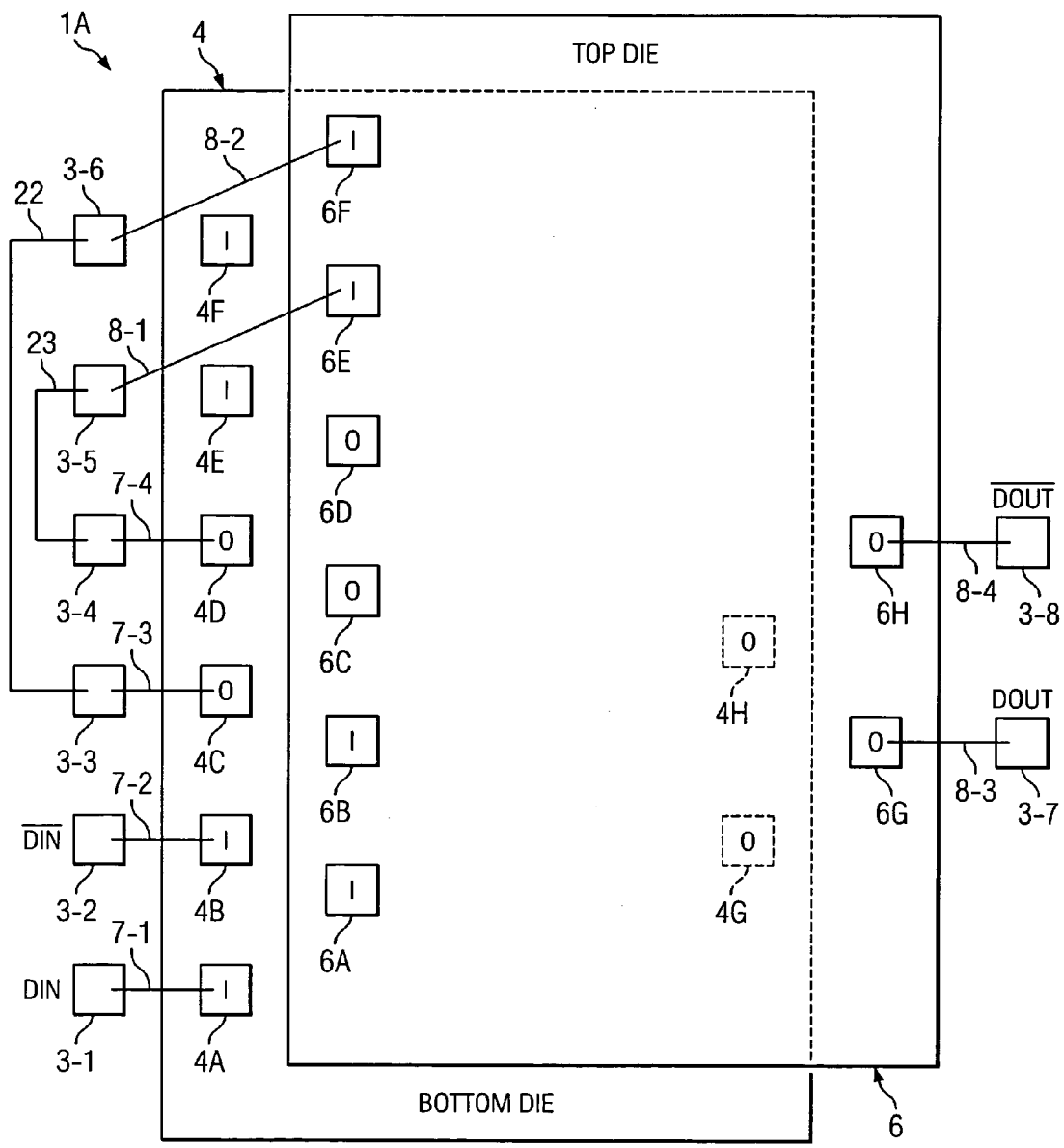
FIG. 2 is a staggered, i.e., partially offset, top plan view of one embodiment of the invention.

FIG. 2 shows a "staggered" or partially offset top plan view of an arrangement of two integrated circuit die stacked generally as shown in prior art FIG. 1A, but connected together in a daisy chained configuration in accordance with one embodiment of the present invention. Bottom die 4 includes six bonding pads 4A, 4B . . . 4F along its left edge. Pads 4A and 4B of bottom die 4 are input pads which are connected by bonding wires 7-1 and 7-2 to package leads (i.e., package pins) 3-1 and 3-2, respectively. The package pin 3-1 conducts a digital input signal DIN, and package pin 3-1 in this example conducts a signal is the logical complement digital input signal $\overline{DIN}$, although pin 3-1 could be omitted or could conduct a different signal than $\overline{DIN}$. Pads 4C and 4D are outputs of bottom die 4, and are coupled by bonding wires 7-3 and 7-4 to package pins 3-3 and 3-4, respectively. Package pins 3-3 and 3-4 are connected by bonding wires or conductors 22 and 23 to package pins 3-5 and 3-6, respectively. Pads 4E and 4F are unconnected or "open" input pads of bottom die 4. Bottom die 4 can include, for example, conventional ADC circuitry such as 105A and conventional daisy chain circuitry such as data register 106A shown in prior art FIG. 1B, with DOUT of data register 106A being internally coupled to output bonding pad 4D of bottom die 4.

Top die 6 may be identical to bottom die 4, and is illustrated in FIG. 2 as being offset upward and to the right, rather than being vertically aligned with bottom die 4 as is actually the case, so as to not obfuscate the illustration of pads 4A–4F of bottom die 4 as shown in FIG. 2. The pads 6A–6D of top die 6 are "open", i.e., unconnected to any bonding wires. Input pads 6E and 6F are connected by bonding wires 8-1 and 8-2 to package pins 3-5 and 3-6, respectively. Top die 6 also can include, for example, conventional ADC circuitry such as 105B and conventional daisy chain circuitry such as data register 106B shown in prior art FIG. 1B, with DIN of data register 106B being internally coupled to input bonding pad 6E of top die 6. DOUT of data register 106B could be internally coupled to output bonding pad 6G of top die 6.

Bottom die 4 has two open output pads 4G and 4H, and top die 6 has two output pads 6G and 6H which are connected by bonding wires 8-3 and 8-4 to package pins 3-7 and 3-8, respectively. Package pin 3-7 conducts a digital signal DOUT, and package pin 3-8 conducts its complement signal $\overline{DOUT}$. The serial sequence outputs DOUT and $\overline{DOUT}$ of binary bits from the bottom die 4 are connected to the inputs DIN and $\overline{DIN}$, respectively, of the top die 6 to form the daisy chain configuration so that the first sequence of binary bits from the top die 6 appears as a first serial digital word on the outputs DOUT and $\overline{DOUT}$, followed by the second sequence of binary bits from the bottom die 4 appearing as a second serial digital word on the outputs DOUT and $\overline{DOUT}$.

Figure 3:
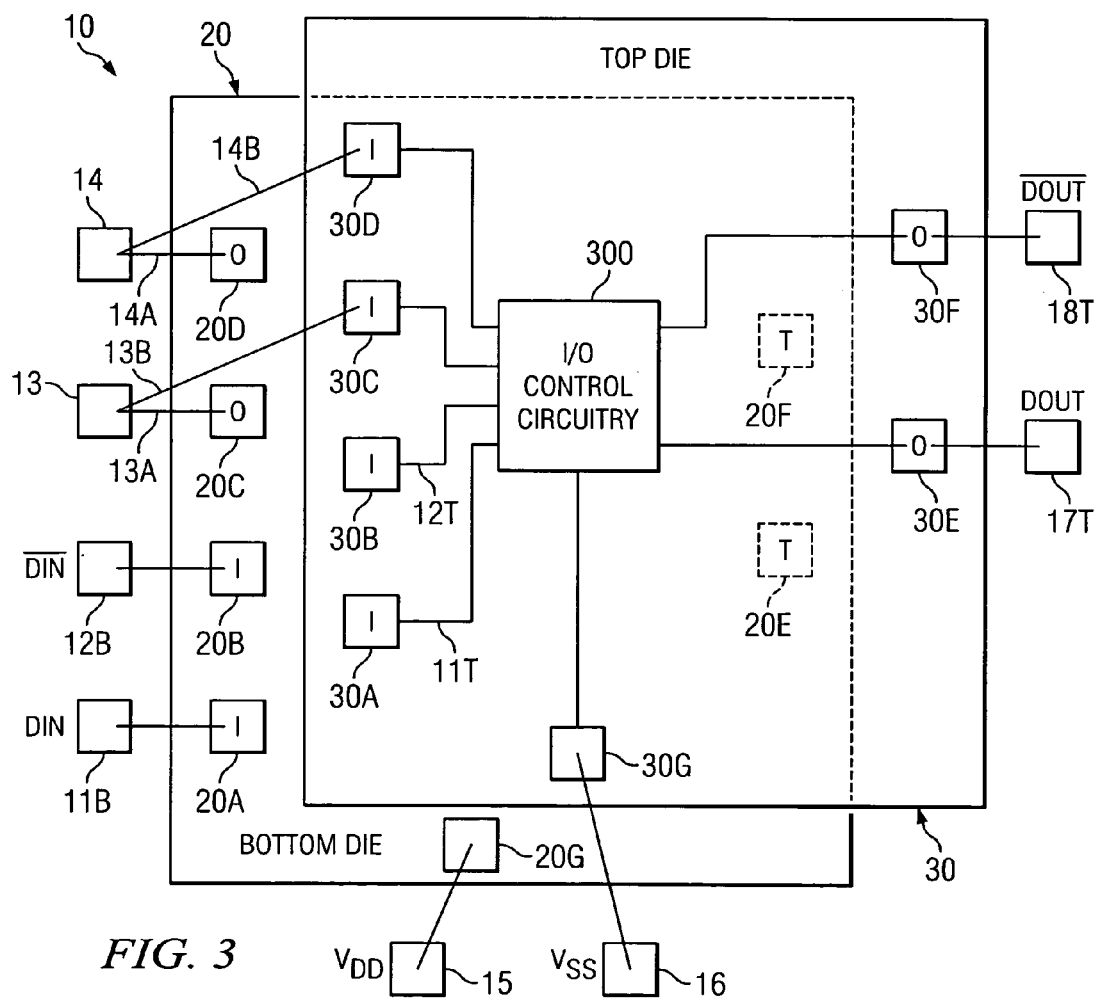
FIG. 3 is a staggered, i.e., partially offset, top plan view of another embodiment of the invention.

The invention also provides input/output control circuitry that allows convenient stacking of integrated circuit die capable of being daisy chained by using substantially fewer bonding pads on each die than the above described prior art. Referring to FIG. 3, a die assembly 10 includes a bottom die 20 and a top die 30 stacked generally as previously described with reference to FIGS. 1 and 2. As in FIG. 2, top die 30 is illustrated in FIG. 3 as being offset for purposes of illustration to expose bonding pads along the left and bottom edges of bottom die 20. In the embodiment of the invention shown in FIG. 3, the circuitry of bottom die 20 is identical to the circuitry of top die 30, although in other embodiments the circuitry in one stacked die could be different than in the other. In accordance with the present invention, bottom die 20 and top die 30 have similar or identical input/output control circuitry, the configuration of which can be controlled by selectively wire bonding an input/output function control bonding pad to various reference voltages used as input/output function control signals.

In FIG. 3, top die 30 includes bonding pads 30A, 30B, 30C, and 30D located along its left edge, each connected to input/output control circuitry 300. Bonding pad 20A, which is configured as an input of bottom die 20, is connected by a wire bond to an external package pin 11B which conducts a digital signal DIN. Bonding pad 20B, which also is configured as an input of bottom die 20, is connected by a bonding wire to an external package pin 12B which conducts its complement signal $\overline{\text{DIN}}$. An input/output control bonding pad 30G is connected to a control input of I/O control circuitry 300. Bonding pads 30E and 30F, which are configured as outputs of top die 30, are located along the right edge of top die 30. Bonding pad 30E is connected by a bonding wire to an external package pin 17T, which conducts a digital output signal DOUT at the end of the daisy chained configuration of bottom die 20 and top die 30. Bonding pad 30F is connected by a bonding wire to an external package pin 18T which conducts the logical complement signal $\overline{\text{DOUT}}$.

The structure of bottom die 20 is identical to that of top die 30. However, the bonding pads along the left edge of bottom die 20 are designated by slightly different reference numerals, specifically, by reference numerals 20A–D, respectively, and the input/output control bonding pad located along the lower edge of bottom die 20 is designated by reference numeral 20G, and the bonding pads located along the right edge of bottom die 20 are designated by reference numerals 20E and 20F, respectively.

The input/output control pad 20G of bottom die 20 is connected to a high power supply voltage VDD by means of a wire bonding connection to an external package pin 15. This causes input/output control circuitry in bottom die 20 (not shown in FIG. 3) to configure bonding pads 20C and 20D as outputs of bottom die 20, as indicated by the letter "O" in the center of each bonding pad. The VDD voltage applied as an input/output function control signal to input/output control pad 20G also causes input/output control circuitry of bottom die 20 to configure bonding pads 20E and 20F as electrically floating or "tri-stated" pads, as indicated by the letter "T" in the center of each of bonding pads 20E and 20F.

Input/output control pad 30G of top die 30 is connected to a low reference voltage VSS on package pin 16. This causes input/output control circuitry 300 of top die 30 to configure bonding pads 30C and 30D as inputs of top die 30, as indicated by the letter "I" in the centers of bonding pads 30C and 30D, and to configure bonding pads 30E and 30F as outputs of top die 30, as indicated by "O" in the centers of the bonding pads 30E and 30F. Bonding pad 30C of top die 30 is connected to bonding pad 20C of bottom die 20 by means of bonding wire 13B, package pin 13, and bonding wire 13A. Similarly, bonding pad 30D of top die 30 is connected to bonding pad 20D by means of bonding wire 14B, package pin 14, and bonding wire 14A. (In a different embodiment, a signal other than $\overline{\text{DIN}}$ could be provided as an input to package pin 12B to provide another input data channel, in which case a corresponding output signal would appear on package pin 18T.)

Figure 4A:
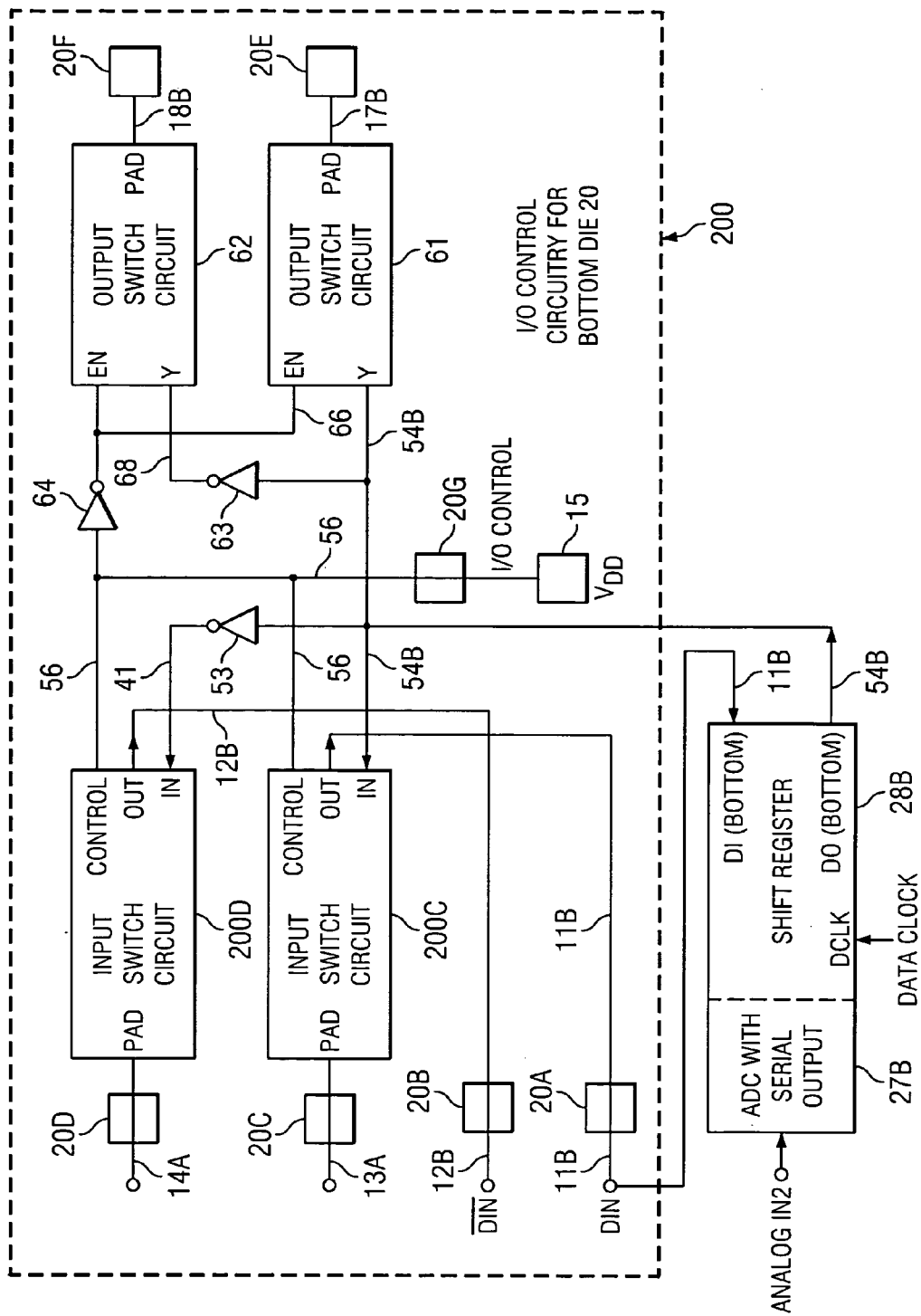
FIG. 4A is a block diagram illustrating a portion of the circuitry of the bottom die 20 of FIG. 3.

As mentioned above, bottom die 20 and top die 30 include similar or identical input/output control circuitry. FIG. 4A shows the connections of such input/output control circuitry 200 of bottom die 20, including an input switch circuit 200C having a terminal labeled "PAD" connected by bonding pad 20C to conductor 13A, and a terminal labeled "CONTROL" connected to I/O CONTROL conductor 56 to receive an input/output function control signal I/O CONTROL. The signal I/O CONTROL is produced by connecting conductor 56 and bonding pad 20G to package pin 15, to which supply voltage VDD is connected as a function control signal. Input switch circuit 200C also includes a terminal OUT connected to conductor 11B and a terminal IN connected to a conductor 54B.

Input/output control circuitry 200 also includes an input switch circuit 200D including a terminal "PAD" connected by bonding pad 20D to conductor 14A, and a terminal "CONTROL" connected to conductor 56 to receive the input/output function control signal I/O CONTROL on bonding pad 20G. Input switch circuit 200D also includes a terminal OUT connected to conductor 12B and a terminal IN connected to conductor 41. Conductor 54B is connected to the input of an inverter 53 having its output connected to conductor 41.

I/O CONTROL conductor 56 also is connected to the input of an inverter 64, the output of which is connected by a conductor 66 to the enable inputs EN of a pair of similar or identical output switch circuits 61 and 62. Output switch circuit 61 has a "Y" input connected to conductor 54B. Output switch circuit 62 has a Y input connected by conductor 68 to the output of an inverter 63 having its input connected to conductor 54B. Output switch circuit 61 has a terminal PAD connected to bonding pad 20E, and output switch circuit 62 has a terminal PAD connected to bonding pad 20F.

Conductor 54B can be connected to the serial data output terminal DO(Bottom) of a conventional external ADC (analog-to-digital converter) circuit 27B of the kind which includes a serial shift register 28B into which the ADC conversion results representing ANALOG IN2 produced by ADC 27B are loaded. A data clock signal DATA CLOCK is applied to the data clock input DCLK of shift register 28B to serially shift the contents of shift register 28B out of DO(Bottom) onto conductor 54B. A data input terminal DI(Bottom) of ADC circuit 27B is connected to DIN conductor 11B. (The logical complement signal of DIN can be generated and applied to $\overline{\text{DIN}}$ conductor 12B.) Bonding pad 20C is configured as an output of bottom die 20 and is wire bonded to bonding pad 30C (FIG. 3), which is configured as an input of a similar or identical top die 30 (details of which are shown in FIG. 4B) stacked on bottom die 20 in such a way as to provide a daisy chain configuration.

Figure 4B:
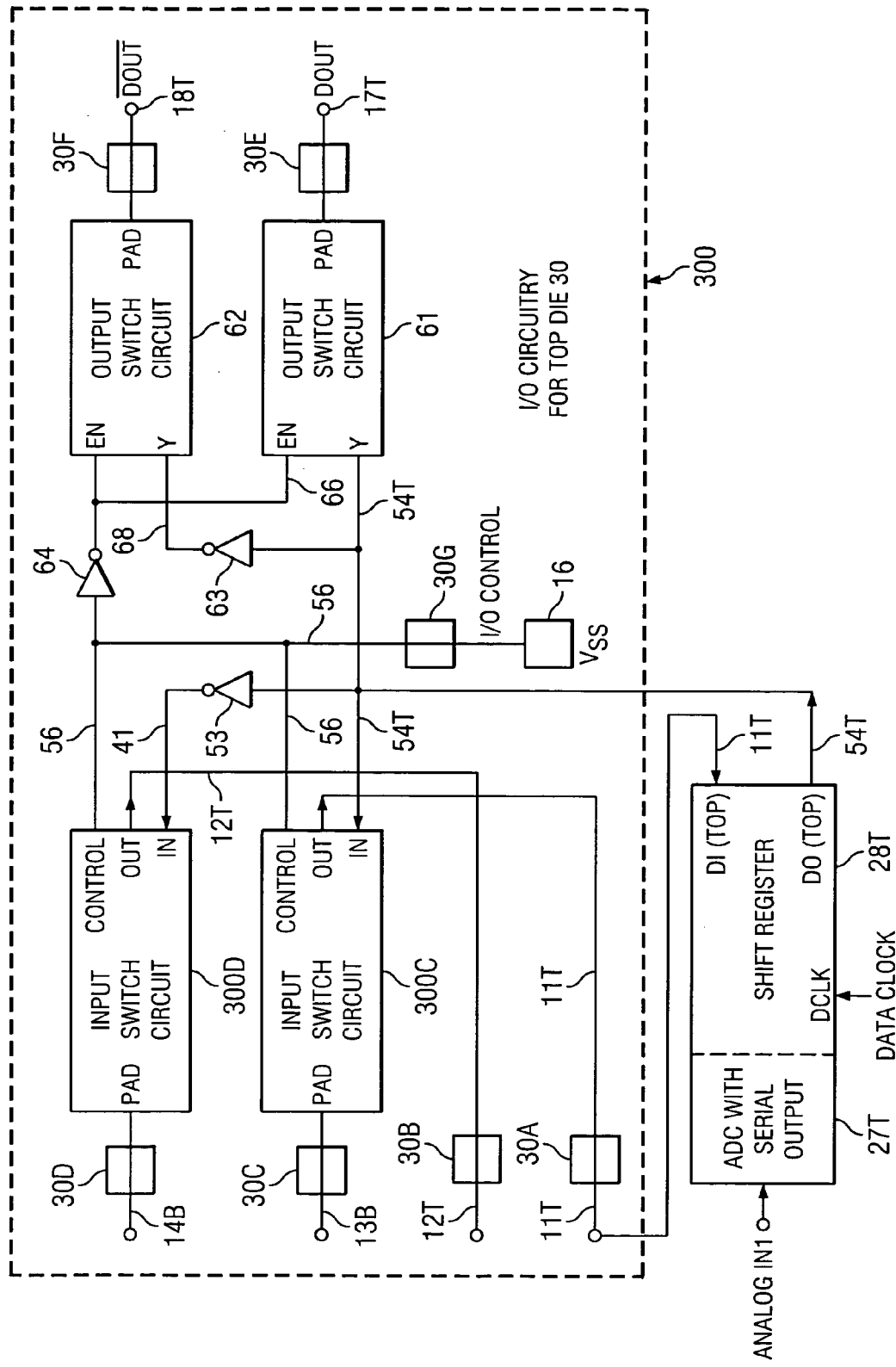
FIG. 4B is a block diagram illustrating a portion of the circuitry of the top die 30 of FIG. 3.

FIG. 4B shows the connections of input/output control circuitry 300 of top die 30, including an input switch circuit 300C including a terminal PAD connected by bonding pad 30C to conductor 13B, and a terminal CONTROL connected to a conductor 56 to receive the signal I/O CONTROL on conductor 56. (Note that where appropriate the same or similar reference numerals are used to designate corresponding parts in FIGS. 4A and 4B.) In FIG. 4B, conductor 56 and bonding pad 30G are connected to supply voltage VSS, which is used as a function control signal applied to bonding pad 16. Input switch circuit 300C also includes a terminal OUT connected to a conductor 11T and a terminal IN connected to a conductor 54T. Input/output control circuitry 300 of FIG. 4B also includes an input switch circuit 300D including a terminal PAD connected by bonding pad 30D to conductor 14B, and a terminal CONTROL connected to conductor 56 to receive the function control signal I/O CONTROL. The input switch circuit 300D also includes a terminal OUT connected to a conductor 12T and a terminal IN connected to a conductor 41. Conductor 54T is connected to the input of an inverter 53 having its output connected to conductor 41.

As in FIG. 4A, I/O CONTROL conductor 56 in FIG. 4B is connected to the input of an inverter 64, the output of which is connected by a conductor 66 to the enable inputs EN of a pair of similar or identical output switch circuits 61 and 62. Output switch circuit 61 has a Y input connected to conductor 54T. Output switch circuit 62 has a Y input connected by conductor 68 to the output of an inverter 63 having its input connected to conductor 54T. Output switch circuit 61 has a terminal PAD connected to bonding pad 30E, and output switch circuit 62 has a terminal PAD connected to bonding pad 30F.

Similarly to the IO circuitry shown in FIG. 4A for bottom die 20, conductor 54T in FIG. 4B can be connected to the serial data output terminal DO(Top) of a conventional external ADC (analog-to-digital converter) circuit 27T of the kind including a serial shift register 28T into which the ADC conversion results representing ANALOG IN1 produced by ADC 27T are loaded. The above-mentioned data clock signal DATA CLOCK is applied to the data clock input DCLK of shift register 28T to serially shift the contents of shift register 28T out of DO(Top). A data input terminal DI(Top) of ADC circuit 27T is connected to DIN conductor 11T. (As in FIG. 4A, the logical complement signal of DIN can be generated and applied to $\overline{\text{DIN}}$ conductor 12B.)

Figure 5:
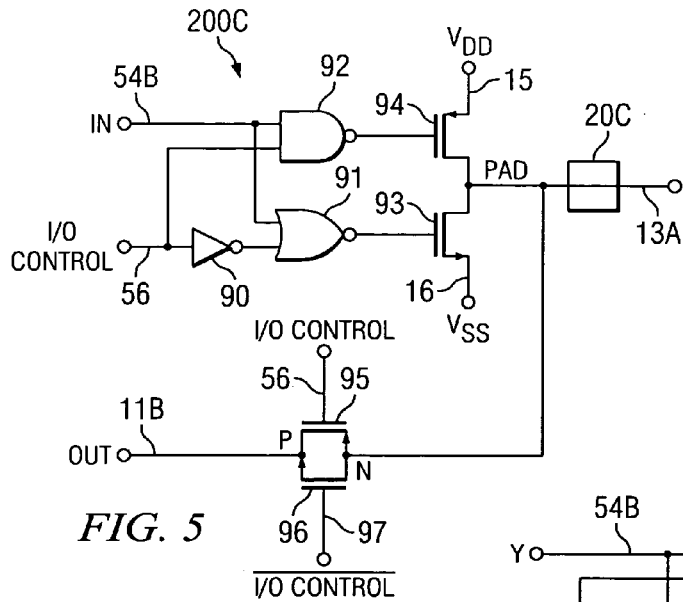
FIG. 5 is a logic diagram of circuitry in block 200C of FIG. 4A.

FIG. 5 shows the details of switch input circuit 200C of FIG. 4A. Conductor 54B is connected to the IN terminal, one input of NAND gate 92, and one input of NOR gate 91. I/O CONTROL conductor 56 is connected to the input of an inverter 90 and to the other input of NAND gate 92. The output of inverter 90 is connected to the other input of NOR gate 91. The output of NAND gate 92 is connected to the gate of a P-channel pull-up transistor 94 which has its source connected to VDD and its drain connected to PAD terminal 13A of input switch circuit 200C. The output of NOR gate 91 is connected to the gate of a N-channel pull-down transistor 93 having its source connected to VSS and its drain connected to the PAD terminal 13A. OUT terminal 11B is connected to the drain of a P-channel transmission gate transistor 95 and the source of a N-channel transmission gate transistor 96. The source of transistor 95 and the drain of transistor 96 are connected to PAD terminal 13A. The gate of transistor 95 is connected to I/O CONTROL conductor 56, and the gate of transistor 96 is connected to a conductor 97 which conducts the logical complement $\overline{\text{I/OCONTROL}}$ of function control signal I/O CONTROL. Input switch circuits 200C and 200D of FIG. 4A and input switch circuits 300C and 300D of FIG. 4B all are identical to input switch circuit 200C of FIG. 5.

If function control signal I/O CONTROL is at a high level, then transistors 95 and 96 in FIG. 5 are turned off, and the terminal IN connected to conductor 54B is configured as an input that reproduces the logic level on IN conductor 54 at PAD conductor 13A. However, if I/O CONTROL is at a low level, then transistors 93 and 94 are turned off and transistors 95 and 96 are turned on, so the logic level on PAD conductor 13A is reproduced on OUT terminal 11B.

Figure 6:
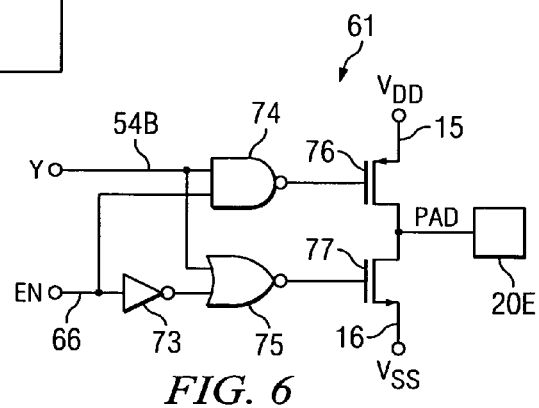
FIG. 6 is a logic diagram of circuitry in block 61 in FIG. 4A.

FIG. 6 shows the details of output switch circuit 61 of FIG. 4A. Output switch circuit 61 has a Y input terminal connected by conductor 54B to one input of NAND gate 74 and one input of NOR gate 75. An enable input EN is connected by conductor 66 to one input of an inverter 73 and to the other input of NAND gate 74. The output of inverter 73 is connected to the other input of NOR gate 75. The output of NAND gate 74 is connected to the gate of P-channel pull-up transistor 76, the drain of which is connected by conductor 15 to VDD. The drain of transistor 76 is connected through the PAD terminal of output switch circuit 61 to bonding pad 20E and to the drain of a N-channel pull-down transistor 77, the source of which is connected to VSS by means of conductor 16. The gate of transistor 77 is connected to the output of NOR gate 75.

Output switch 61 of FIG. 4B is identical to output switch circuit 61 of FIG. 4A except PAD output 18T in FIG. 4B is connected to bonding pad 30E. Output switch circuits 62 of FIGS. 4A and 4B are identical to output switch circuit 61 of FIG. 4A, except that the PAD terminal of output switch circuit 62 is connected by conductor 68 to bonding pad 20F and its Y input is connected to the output of inverter 63.

If EN in FIG. 6 is at a low level, output switch circuit 61 causes transistors 76 and 77 to be off, so the output 20E is electrically floating or "tri-stated". If EN is at a high level, then the logic level of terminal Y on conductor 54B is reproduced on PAD output 20E. Since EN is the logical complement of I/O CONTROL produced by inverter 64, if I/O CONTROL is at a high level, then PAD output 20E is electrically floating or tri-stated, and if I/O CONTROL is at a low level, then the logic level of terminal Y on conductor 54B is reproduced on PAD output 20E.

After ADC 27T and ADC 27B have completed their respective conversions of ANALOG IN1 and ANALOG IN2 to corresponding digital values, i.e., to corresponding "digital conversion results", then the signal DATA CLOCK begins serially shifting the digital conversion results in shift registers 28T and 28B out of shift register output terminals DO(Top) and DO(Bottom), respectively. In the case of top die 30, the digital conversion results being shifted out of DO(Top) of shift register 28T are conducted by conductor 54T of top die 30 to the Y input of output switch circuit 61 of top die 30, which is configured as an output by the low VSS level on I/O function control conductor 56 of top die 30. This results in a "1" level at the EN input of output switch circuit 61. Consequently, the digital data being shifted out of DO(Top) is reproduced on bonding pad 30E and package pin 17T by the action of logic gates 74 and 75 (FIG. 6) of output switch circuit 61 of top die 30.

Simultaneously, the digital conversion results being shifted out of DO(Bottom) of shift register 28B are conducted by conductor 54B of bottom die 20 to the IN terminal of input switch circuit 200C of bottom die 20 and are replicated on bonding pad 20C through the action of logic gates 91 in the 92 (FIG. 5), and therefore also are replicated on bonding pad 30C through bonding wires 13A and 13B of FIG. 3. Therefore, the digital conversion results representing ANALOG IN2 being shifted out of DO(Bottom) of shift register 28B are transmitted through transmission gate transistors 95 and 96 (FIG. 5) of input switch circuit 300C of top die 30 to conductor 11T of input switch circuit 300C of top die 30, because the low value of VSS on function control conductor 56 of top die 30 causes the foregoing transmission gate transistors 95 and 96 to be turned on. In this manner, the digital conversion results representing ANALOG IN2 being shifted out of DO(Bottom) of shift register 28B are applied by conductor 11T to the DI(Top) the terminal of shift register 28T and are shifted into shift register 28T at the same rate that the digital conversion results representing ANALOG IN1 are being shifted out of DO(Top) of shift register 28T to bonding pad 30E and to package pin 17T.

Thus, the after the analog-to-digital conversions by ADC 27B and ADC 27T have been completed, the results of the analog-to-digital conversion by ADC 27T connected to top die 30 are serially clocked out of shift register 28T onto DOUT pad 30E of top die 30, and then are automatically and immediately followed by the serially clocked out results of the analog-to-digital conversion by ADC 27B and loaded into shift register 28B of bottom die 20 which are being serially clocked, bit by bit, into shift register 28T to replace its initial bits as they are serially clocked out of pad 30E.

This structure and operation thus provides the desired daisy chain operation wherein the digital conversion results from both ADC 27B and 27T are automatically and sequentially obtained on the single DOUT package pin 17T.

In the embodiment of invention illustrated in FIGS. 4A and 4B, operation analogous to that described above can be used to produce the logical complement signal $\overline{\text{DOUT}}$ on package pin 18T.

Figure 7:
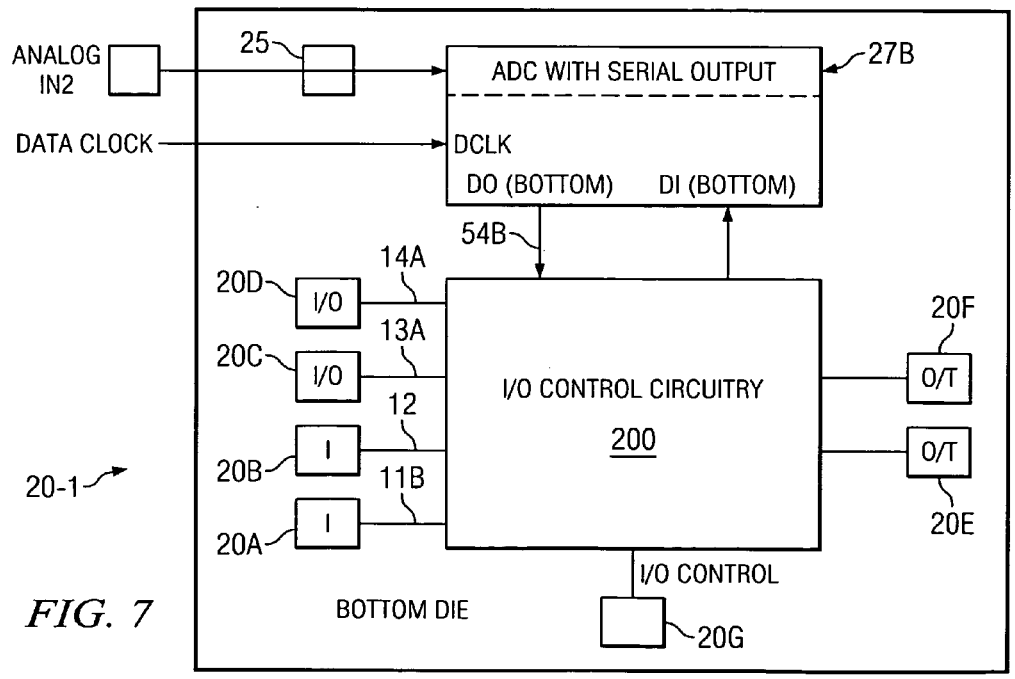
FIG. 7 is a logic diagram of a stackable die including the input/output configuration circuitry of FIG. 4A and a serial output analog to digital converter connected as an internal serial data source.

FIG. 7 shows a variation 20-1 of integrated circuit die 20 of FIG. 3 in which external ADC 27B as in FIG. 4A is included within bottom die 20. A bonding pad bonding pad 25 in die 20 is coupled by a bonding wire to an external package pin conducting the analog input signal ANALOG IN2, as in FIG. 4A. Bonding pad 25 is connected to the analog input of internal ADC 27B, which includes conventional circuitry that produces a serial digital output signal DO(Bottom) representing ANALOG IN2 on conductor 54B of I/O CONTROL CIRCUITRY 200. ADC 27B and shift register 28B can be as previously described with reference to FIG. 4A.

To function as a bottom die, pads 20C and 20D are configured as outputs which are wire bonded to corresponding package pins. To function as a top die, pads 20A and 20B are configured as inputs, which are wire bonded to appropriate package pins. They are useful if multiple packaged units including stacked die are laid out on a printed circuit board and configured to form a daisy chain.

Although the above described input/output control circuitry is described for a system in which two die are stacked and daisy chained, the same general approach can be utilized to provide input/output control circuitry that permits additional die to be stacked and daisy chain.

Thus, the embodiment of invention shown in FIGS. 3–7 provides input/output control circuitry in an integrated circuit die that includes circuitry for daisy chaining of multiple integrated die, wherein the input/output control circuitry allows configuration input/output circuitry of the integrated die by wire bonding an input/output control pad to a selected reference voltage. This allows convenient stacking of identical or different integrated circuit die, wherein their input/output circuitry is configured in accordance with the stacked relationship of each integrated circuit die to another. The result is a substantial reduction in the number of bonding pads required for each integrated circuit die and a substantial reduction in the amount of routing of conductors in a system including the integrated circuit die. Unused output bonding pads of the integrated circuit die are electrically floating or tri-stated, which results in reduced circuit and system delay caused by capacitance associated with the electrically floating output bonding pads, because during the daisy chain configuration, the readout speed would be reduced if more capacitive loading is present and thereby causing delay in the signal path. (If the functionality of the input/output pads is not configurable, there are two choices of implementation. First, the output pads are connected together by conductors and are driven by only one large output buffer circuit. In this case, the capacitive loading appears in the signal path. Second, the two output pads are driven by two different buffer circuits which have the same input. For this case, the loading of unused output pad is not in the signal path, but the noise generated by driving it may be coupled to the analog circuitry, which may be undesirable.)

Another advantage of the described programmable-function bonding pads and associated input/output circuitry is that it makes the location of a particular bonding pad function programmable. This may greatly facilitate wire bonding operations by allowing a bonding pad on the top die to be connected by wire bonding to a bonding pad along the same edge of the bottom die, and preferably located conveniently beneath the bonding pad on the top die. As another example, output bonding pad 30E in FIG. 3 could be located along the same edge as input bonding pad 30A, which in some cases could be very convenient. If input and output bonding pads can be located along the same edge, pads 30A and 30B can be programmed as outputs and pads 20E, 20F, 30E, and 30F would not be needed. In some cases, the capability of having programmable-function bonding pads can reduce the number of bonding pads needed on a particular integrated circuit die.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, just as more than 2 integrated circuit die each directly attached to a printed circuit board can be daisy chained in the fashion indicated in prior art FIG. 1B, the present invention can be extended to stacking more than 2 integrated circuit die having programmable-function bonding pads according to the present invention can be stacked in a single stack as shown in FIG. 3 interconnected so that they are daisy chained in essentially the same manner described.

What is claimed is:

1. A first integrated circuit die adapted for die stacking, comprising:
   (a) an input/output function control bonding pad;
   (b) a first bonding pad controllable to function as either an input or an output in response to an input/output function control signal applied to the input/output function control bonding pad;
   (c) a second bonding pad controllable to function in a first mode or in a second mode in response to the input/output function control signal;
   (d) input/output control circuitry coupled to the first bonding pad and also coupled to the input/output control bonding pad for
      i. causing the first bonding pad to function as an output of the first integrated circuit die when the input/output function control signal is equal to a first reference voltage and for causing the second bonding pad to function in the first mode when the input/output function control signal is equal to the first reference voltage, and
      ii. causing the first bonding pad to function as an input of the first integrated circuit die when the input/output function control signal is equal to a second reference voltage and for causing the second bonding pad to function in the second mode when the input/output function control signal is equal to the second reference voltage;
   (e) the input/output function control circuitry of the first integrated circuit die functioning in cooperation with corresponding input/output function control circuitry in a second integrated circuit die similar to the first integrated circuit die and stacked on the first integrated circuit die to form a selected path for communication of information between the first and second integrated circuit die when the first bonding pad of the first integrated circuit die is connected by a wire bond to a corresponding first bonding pad of the second integrated circuit die.

2. The first integrated circuit die of claim 1 wherein the first bonding pad of the first integrated circuit die is located approximately directly beneath the corresponding first bonding pad of the second integrated circuit die.

3. The first integrated circuit die of claim 2 wherein a second bonding pad of the second integrated circuit die is located along an edge of the second integrated circuit die opposite to an edge along which the corresponding first bonding pad is located.

4. The first integrated circuit die of claim 1 wherein the selected path communicates digital data.

5. A first integrated circuit die adapted for die stacking, comprising:
(a) an input/output function control bonding pad;
(b) a first bonding pad controllable to function as either an input or an output in response to an input/output function control signal applied to the input/output function control bonding pad;
(c) a second bonding pad controllable to function as either an output of the first integrated circuit die or as an electrically floating bonding pad in response to the input/output function control signal;
(d) input/output control circuitry coupled to the first bonding pad and also coupled to the input/output control bonding pad for
  i. causing the first bonding pad to function as an output of the first integrated circuit die when the input/output function control signal is equal to a first reference voltage and for causing the second bonding pad to function as an electrically floating bonding pad when the input/output function control signal is equal to the first reference voltage, and
  ii. causing the first bonding pad to function as an input of the first integrated circuit die when the input/output function control signal is equal to a second reference voltage and for causing the second bonding pad to function as an output of the first integrated circuit die when the input/output function control signal is equal to the second reference voltage;
(e) the input/output function control circuitry of the first integrated circuit die functioning in cooperation with corresponding input/output function control circuitry in a second integrated circuit die similar to the first integrated circuit die and stacked on the first integrated circuit die to form a daisy chain when the first bonding pad of the first integrated circuit die is connected by a wire bond to a corresponding first bonding pad of the second integrated circuit die.

6. The first integrated circuit die of claim 5 wherein the input/output control circuitry includes an input switch circuit including a pad terminal connected to the first bonding pad, a control terminal coupled by a first conductor to the input/output function control bonding pad, an input terminal coupled to a second conductor, and an output terminal coupled to a third conductor, and wherein the input/output control circuitry also includes an input switch circuit including a pad terminal connected to the second bonding pad, an enable input coupled to the input/output function control bonding pad, and a data input coupled to the second conductor.

7. The first integrated circuit die of claim 6 wherein the input switch circuit includes an ANDing circuit, an ORing circuit, a pull-up transistor, a pull-down transistor, a transmission gate circuit, and an inverter, a first input of the ANDing circuit and a first input of the ORing circuit being coupled to the second conductor, an output of the ANDing circuit being coupled to a gate of the pull-up transistor, an output of the ORing circuit being coupled to a gate of the pull-down transistor, the first conductor being coupled to a second input of the ANDing circuit and an input of an inverter, an output of the inverter being coupled to a second input of the ORing circuit, drains of the pull-up transistor and the pull-down transistor being coupled to the first bonding pad and a first terminal of the transmission gate circuit, a second terminal of the transmission gate circuit being coupled to the third conductor, a control terminal of the transmission gate circuit being coupled to the first conductor.

8. The first integrated circuit die of claim 7 wherein the pull-up transistor is a P-channel transistor and the pull-down transistor is an N-channel transistor.

9. The first integrated circuit die of claim 7 wherein the ANDing circuit includes a NAND gate, and wherein the ORing circuit includes a NOR gate.

10. The first integrated circuit die of claim 6 wherein the output switch circuit includes an ANDing circuit, an ORing circuit, a pull-up transistor, a pull-down transistor, and an inverter, a first input of the ANDing circuit and a first input of the ORing circuit being coupled to the second conductor, an output of the ANDing circuit being coupled to a gate of the pull-up transistor, an output of the ORing circuit being coupled to a gate of the pull-down transistor, the first conductor being coupled to a second input of the ANDing circuit and an input of the inverter, an output of the inverter being coupled to a second input of the ORing circuit, drains of the pull-up transistor and first pull-down transistor being coupled to the second bonding pad.

11. The first integrated circuit die of claim 10 wherein the pull-up transistor is a P-channel transistor and the pull-down transistor is an N-channel transistor.

12. The first integrated circuit die of claim 10 wherein the ANDing circuit includes a NAND gate, and wherein the ORing circuit includes a NOR gate.

13. The first integrated circuit die of claim 6 wherein
(1) the input switch circuit includes a first ANDing circuit, a first ORing circuit, a first pull-up transistor, a first pull-down transistor, a transmission gate circuit, and a first inverter, a first input of the first ANDing circuit and a first input of the first ORing circuit being coupled to the second conductor, an output of the first ANDing circuit being coupled to a gate of the first pull-up transistor, an output of the first ORing circuit being coupled to a gate of the first pull-down transistor, the first conductor being coupled to a second input of the first ANDing circuit and an input of the first inverter, an output of the first inverter being coupled to a second input of the first ORing circuit, drains of the first pull-up transistor and the first pull-down transistor being coupled to the first bonding pad and a first terminal of the transmission gate circuit, a second terminal of the transmission gate circuit being coupled to the third conductor, a control terminal of the transmission gate circuit being coupled to the first conductor, and
(2) wherein the output switch circuit includes a second ANDing circuit, a second ORing circuit, a second pull-up transistor, a second pull-down transistor, and a second inverter, a first input of the second ANDing circuit and a first input of the second ORing circuit being coupled to the second conductor, an output of the second ANDing circuit being coupled to a gate of the second pull-up transistor, an output of the second ORing circuit being coupled to a gate of the second pull-down transistor, the first conductor being coupled to a second input of the second ANDing circuit and an input of the second inverter, an output of the second inverter being coupled to a second input of the second ORing circuit, drains of the second pull-up transistor and the second pull-down transistor being coupled to the second bonding pad.

14. The first integrated circuit die of claim 13 including a third inverter having an input coupled to the first conductor for coupling the input/output function control signal to the enable input of the output switch circuit.

15. The first integrated circuit die of claim 5 including a serial-output analog-to-digital converter coupled to the second conductor to provide a stream of serial data bits to be daisy chained to an input pad of the second integrated circuit die.

16. The first integrated circuit die of claim 5 including a first shift register having a data output terminal and a data input terminal, the second integrated circuit die including a second shift register having a data output terminal and a data input terminal, the data output terminal of the first integrated circuit die being coupled by the input/output control circuitry of the first integrated circuit die to the data input terminal of the second integrated circuit die to cause a first digital word in the first shift register to be shifted into the second shift register as a second digital word is being shifted out of the output terminal of the second shift register.

17. A method of stacking integrated circuit die to provide a daisy chain function, comprising:
 (a) providing a bottom integrated circuit die including an input/output function control bonding pad, a first bonding pad controllable to function as either an input bonding pad or an output bonding pad of the bottom integrated circuit die in response to a first input/output function control signal applied to the input/output function control bonding pad, and a second bonding pad controllable to function either a first mode or a second mode in response to the first input/output function control signal;
 (b) providing a top integrated circuit die including an input/output function control bonding pad, a first bonding pad controllable to function as either an input or an output bonding pad of the top integrated circuit die in response to a second input/output function control signal applied to the input/output function control bonding pad of the top integrated circuit die, and a second bonding pad controllable to function a third mode or a fourth mode in response to the second input/output function control signal;
 (c) stacking the top integrated circuit die above the bottom integrated circuit die and wire bonding the first bonding pad of the bottom integrated circuit die to the first bonding pad of the top integrated circuit die;
 (d) operating input/output control circuitry of the bottom integrated circuit die coupled to the first bonding pad and the input/output control bonding pad of the bottom integrated circuit die to cause the first bonding pad of the bottom integrated circuit die to function as an output bonding pad of the bottom integrated circuit die when the first input/output function control signal is equal to a first reference voltage and to cause the second bonding pad of the bottom integrated circuit die to function in the first mode when the first input/output function control signal is equal to the first reference voltage; and
 (e) operating input/output control circuitry of the top integrated circuit die coupled to the first bonding pad and the input/output control bonding pad of the top integrated circuit die to cause the first bonding pad of the top integrated circuit die to function as an input of the top integrated circuit die when the second input/output function control signal is equal to a second reference voltage and to cause the second bonding pad of the top integrated circuit die to function in the third mode when the second input/output function control signal is equal to the second reference voltage;
 (f) the input/output function control circuitry of the bottom integrated circuit die functioning in cooperation with the input/output function control circuitry in the top integrated circuit die to form a selected path for communication of information between the first and second integrated circuit die.

18. The method of claim 17 including communicating digital data via the selected path.

19. A method of stacking integrated circuit die to provide a daisy chain function, comprising:
 (a) providing a bottom integrated circuit die including an input/output function control bonding pad, a first bonding pad controllable to function as either an input bonding pad or an output bonding pad of the bottom integrated circuit die in response to a first input/output function control signal applied to the input/output function control bonding pad, and a second bonding pad controllable to function as either an output bonding pad of the bottom integrated circuit die or as an electrically floating bonding pad in response to the first input/output function control signal;
 (b) providing a top integrated circuit die including an input/output function control bonding pad, a first bonding pad controllable to function as either an input or an output bonding pad of the top integrated circuit die in response to a second input/output function control signal applied to the input/output function control bonding pad of the top integrated circuit die, and a second bonding pad controllable to function as either an input bonding pad of the top integrated circuit die or as an electrically floating bonding pad in response to the second input/output function control signal;
 (c) stacking the top integrated circuit die above the bottom integrated circuit die and wire bonding the first bonding pad of the bottom integrated circuit die to the first bonding pad of the top integrated circuit die;
 (d) operating input/output control circuitry of the bottom integrated circuit die coupled to the first bonding pad and the input/output control bonding pad of the bottom integrated circuit die to cause the first bonding pad of the bottom integrated circuit die to function as an output bonding pad of the bottom integrated circuit die when the first input/output function control signal is equal to a first reference voltage and to cause the second bonding pad of the bottom integrated circuit die to function as an electrically floating bonding pad when the first input/output function control signal is equal to the first reference voltage; and
 (e) operating input/output control circuitry of the top integrated circuit die coupled to the first bonding pad and the input/output control bonding pad of the top integrated circuit die to cause the first bonding pad of the top integrated circuit die to function as an input of the top integrated circuit die when the second input/output function control signal is equal to a second reference voltage and to cause the second bonding pad of the top integrated circuit die to function as an output pad when the second input/output function control signal is equal to the second reference voltage;

(f) the input/output function control circuitry of the bottom integrated circuit die functioning in cooperation with the input/output function control circuitry in the top integrated circuit die to provide a daisy chain function.

20. A plurality of integrated circuit die stacked and configured to provide a daisy chain function, comprising:

(a) a bottom integrated circuit die including an input/output function control bonding pad, a first bonding pad controllable to function as either an input or an output bonding pad of the bottom integrated circuit die in response to a first input/output function control signal applied to the input/output function control bonding pad, and a second bonding pad controllable to function as either an input bonding pad of the first integrated circuit die or as an electrically floating bonding pad in response to the input/output function control signal;

(b) a top integrated circuit die including an input/output function control bonding pad, a first bonding pad controllable to function as either an input or an output bonding pad of the top integrated circuit die in response to a second input/output function control signal applied to the input/output function control bonding pad of the top integrated circuit die, and a second bonding pad controllable to function as either an input bonding pad of the top integrated circuit die or as an electrically floating bonding pad in response to the second input/output function control signal;

(c) means for stacking the top integrated circuit die above the bottom integrated circuit die and wire bonding the first bonding pad of the bottom integrated circuit die to the first bonding pad of the top integrated circuit die;

(d) input/output control means of the bottom integrated circuit die coupled to the first bonding pad and the input/output control bonding pad of the bottom integrated circuit die for causing the first bonding pad of the bottom integrated circuit die to function as an output bonding pad of the bottom integrated circuit die when the first input/output function control signal is equal to a first reference voltage and for causing the second bonding pad of the bottom integrated circuit die to function as an electrically floating bonding pad when the first input/output function control signal is equal to the first reference voltage; and (e) input/output control means of the top integrated circuit die coupled to the first bonding pad and the input/output control bonding pad of the top integrated circuit die for causing the first bonding pad of the top integrated circuit die to function as an input bonding pad of the top integrated circuit die when the second input/output function control signal is equal to a second reference voltage and for causing the second bonding pad of the top integrated circuit die to function as an output bonding pad when the second input output function control signal is equal to the second reference voltage; and (f) the input/output function control means of the bottom integrated circuit die functioning in cooperation with the input/output function control means in the top integrated circuit die to provide a daisy chain function.

21. A daisy chained assembly of integrated circuit die, comprising:

(a) a first die and a second die stacked on the first die, a first bonding pad on the first die being wire bonded to a second bonding pad on the second die, a third bonding pad being located on the first die, and a fourth bonding pad being located on the second die;

(b) first input/output control circuitry in the first die coupled to the first bonding pad and also coupled to a first input/output control bonding pad on the first die for causing the first bonding pad to function as an output of the first die in response to a first reference voltage applied as a first function control signal to the first input/output control bonding pad and for causing the third bonding pad to function as an electrically floating conductor in response to the first function control signal;

(c) second input/output control circuitry in the second die coupled to the second bonding pad and also coupled to a second input/output control bonding pad on the second die for causing the second bonding pad to function as an input of the second die in response to a second reference voltage applied as a second function control signal to the second input/output control bonding pad and for causing the fourth bonding pad to function as an output of the second chip in response to the second function control signal;

(d) a serial data source coupled to an input of the first input/output control circuitry for supplying a first stream of serial data bits to a data input of the first input/output control circuitry;

(e) the first bonding pad supplying a second stream of serial data bits from the first die to the second bonding pad of the second die.

* * * * *